United States Patent
Ingle et al.

(10) Patent No.: US 8,980,382 B2
(45) Date of Patent: *Mar. 17, 2015

(54) OXYGEN-DOPING FOR NON-CARBON RADICAL-COMPONENT CVD FILMS

(75) Inventors: Nitin Ingle, San Jose, CA (US); Abhijit Basu Mallick, Palo Alto, CA (US); Earl Osman Solis, San Jose, CA (US); Nicolay Kovarsky, Sunnyvale, CA (US); Olga Lyubimova, Edmonton (CA)

(73) Assignee: Applied Materials, Inc., Santa Clara, CA (US)

( * ) Notice: Subject to any disclaimer, the term of this patent is extended or adjusted under 35 U.S.C. 154(b) by 583 days.

This patent is subject to a terminal disclaimer.

(21) Appl. No.: 12/836,991

(22) Filed: Jul. 15, 2010

(65) Prior Publication Data

US 2011/0129616 A1 Jun. 2, 2011

Related U.S. Application Data (60) Provisional application No. 61/265,865, filed on Dec. 2, 2009.

(51) Int. Cl.
*B05D 1/34* (2006.01)
*H05H 1/24* (2006.01)
(Continued)

(52) U.S. Cl.
CPC ............. *C23C 16/308* (2013.01); *C23C 16/402* (2013.01); *C23C 16/452* (2013.01);
(Continued)

(58) Field of Classification Search
None
See application file for complete search history.

(56) References Cited

U.S. PATENT DOCUMENTS

| 4,147,571 A | 4/1979 | Stringfellow et al. |
| 4,200,666 A | 4/1980 | Reinberg |

(Continued)

FOREIGN PATENT DOCUMENTS

| EP | 0892083 A1 | 1/1999 |
| EP | 1095958 B1 | 5/2001 |

(Continued)

OTHER PUBLICATIONS

Aylett, B. J. et al., "Silicon-Nitrogen Compounds. Part V. Diphenylamino-derivatives of Silane," J. Chem. Soc. (A), 1969, pp. 636-638, Inorganic Physical Theory.

(Continued)

*Primary Examiner* — Marianne L Padgett
(74) *Attorney, Agent, or Firm* — Kilpatrick Townsend & Stockton LLP (57) ABSTRACT

Methods of forming silicon oxide layers are described. The methods include the steps of concurrently combining both a radical precursor and a radical-oxygen precursor with a carbon-free silicon-containing precursor. One of the radical precursor and the silicon-containing precursor contain nitrogen. The methods result in depositing a silicon-oxygen-and-nitrogen-containing layer on a substrate. The oxygen content of the silicon-oxygen-and-nitrogen-containing layer is then increased to form a silicon oxide layer which may contain very little nitrogen. The radical-oxygen precursor and the radical precursor may be produced in separate plasmas or the same plasma. The increase in oxygen content may be brought about by annealing the layer in the presence of an oxygen-containing atmosphere and the density of the film may be increased further by raising the temperature even higher in an inert environment.

16 Claims, 6 Drawing Sheets

(51) Int. Cl.
  *C23C 16/34* (2006.01)
  *C23C 16/40* (2006.01)
  *C23C 16/50* (2006.01)
  *C23C 16/56* (2006.01)
  *C23C 16/30* (2006.01)
  *C23C 16/452* (2006.01)
  *C23C 16/455* (2006.01)
  *H01J 37/32* (2006.01)
  *H05H 1/46* (2006.01)

(52) U.S. Cl.
  CPC ........... *C23C16/45565* (2013.01); *C23C 16/56* (2013.01); *H01J 37/32082* (2013.01); *H01J 37/32357* (2013.01); *H01J 37/32449* (2013.01)
  USPC ........... 427/563; 427/579; 427/574; 438/788; 438/792

(56) References Cited

U.S. PATENT DOCUMENTS

| | | | |
|---|---|---|---|
| 4,816,098 | A | 3/1989 | Davis et al. |
| 4,818,326 | A | 4/1989 | Liu et al. |
| 4,910,043 | A | 3/1990 | Freeman et al. |
| 4,931,354 | A | 6/1990 | Wakino et al. |
| 4,946,593 | A | 8/1990 | Pinigis |
| 5,016,332 | A | 5/1991 | Reichelderfer et al. |
| 5,110,407 | A | 5/1992 | Ono et al. |
| 5,212,119 | A | 5/1993 | Hah et al. |
| 5,271,972 | A | 12/1993 | Kwok et al. |
| 5,279,784 | A | 1/1994 | Bender et al. |
| 5,393,708 | A | 2/1995 | Hsia et al. |
| 5,426,076 | A | 6/1995 | Moghadam |
| 5,434,109 | A | 7/1995 | Geissler et al. |
| 5,468,687 | A | 11/1995 | Carl et al. |
| 5,485,420 | A | 1/1996 | Lage et al. |
| 5,530,293 | A | 6/1996 | Cohen et al. |
| 5,547,703 | A | 8/1996 | Camilletti et al. |
| 5,558,717 | A | 9/1996 | Zhao et al. |
| 5,578,532 | A | 11/1996 | van de Ven et al. |
| 5,587,014 | A | 12/1996 | Iyechika et al. |
| 5,593,741 | A | 1/1997 | Ikeda |
| 5,620,525 | A | 4/1997 | van de Ven et al. |
| 5,622,784 | A | 4/1997 | Okaue et al. |
| 5,635,409 | A | 6/1997 | Moslehi |
| 5,665,643 | A | 9/1997 | Shin |
| 5,691,009 | A | 11/1997 | Sandhu |
| 5,769,951 | A | 6/1998 | van de Ven et al. |
| 5,786,263 | A | 7/1998 | Perera |
| 5,811,325 | A | 9/1998 | Lin et al. |
| 5,843,233 | A | 12/1998 | van de Ven et al. |
| 5,853,607 | A | 12/1998 | Zhao et al. |
| 5,882,417 | A | 3/1999 | van de Ven et al. |
| 5,925,411 | A | 7/1999 | van de Ven et al. |
| 5,935,340 | A | 8/1999 | Xia et al. |
| 5,937,308 | A | 8/1999 | Gardner et al. |
| 5,937,323 | A | 8/1999 | Orczyk et al. |
| 5,966,595 | A * | 10/1999 | Thakur et al. ................ 438/151 |
| 6,008,515 | A | 12/1999 | Hsia et al. |
| 6,009,830 | A | 1/2000 | Li et al. |
| 6,014,979 | A | 1/2000 | Van Autryve et al. |
| 6,017,791 | A | 1/2000 | Wang et al. |
| 6,024,044 | A | 2/2000 | Law et al. |
| 6,087,243 | A | 7/2000 | Wang |
| 6,090,442 | A | 7/2000 | Klaus et al. |
| 6,090,723 | A | 7/2000 | Thakur et al. |
| 6,114,219 | A | 9/2000 | Spikes et al. |
| 6,121,130 | A | 9/2000 | Chua et al. |
| 6,140,242 | A | 10/2000 | Oh et al. |
| 6,146,970 | A | 11/2000 | Witek et al. |
| 6,150,286 | A | 11/2000 | Sun et al. |
| 6,156,394 | A | 12/2000 | Yamasaki et al. |
| 6,156,581 | A | 12/2000 | Vaudo et al. |
| 6,165,834 | A | 12/2000 | Agarwal et al. |
| 6,180,490 | B1 | 1/2001 | Vassiliev et al. |
| 6,187,682 | B1 | 2/2001 | Denning et al. |
| 6,191,004 | B1 | 2/2001 | Hsiao |
| 6,207,587 | B1 | 3/2001 | Li et al. |
| 6,258,690 | B1 | 7/2001 | Zenke |
| 6,287,962 | B1 | 9/2001 | Lin |
| 6,302,964 | B1 | 10/2001 | Umotoy et al. |
| 6,383,954 | B1 | 5/2002 | Wang et al. |
| 6,387,207 | B1 | 5/2002 | Janakiraman et al. |
| 6,406,677 | B1 | 6/2002 | Carter et al. |
| 6,413,583 | B1 | 7/2002 | Moghadam et al. |
| 6,448,187 | B2 | 9/2002 | Yau et al. |
| 6,469,283 | B1 | 10/2002 | Burkhart et al. |
| 6,503,557 | B1 | 1/2003 | Joret |
| 6,506,253 | B2 | 1/2003 | Sakuma |
| 6,508,879 | B1 | 1/2003 | Hashimoto |
| 6,509,283 | B1 | 1/2003 | Thomas |
| 6,524,931 | B1 | 2/2003 | Perera |
| 6,528,332 | B2 | 3/2003 | Mahanpour et al. |
| 6,544,900 | B2 | 4/2003 | Raaijmakers et al. |
| 6,548,416 | B2 | 4/2003 | Han et al. |
| 6,548,899 | B2 | 4/2003 | Ross |
| 6,559,026 | B1 | 5/2003 | Rossman et al. |
| 6,566,278 | B1 | 5/2003 | Harvey et al. |
| 6,583,063 | B1 | 6/2003 | Khan et al. |
| 6,589,868 | B2 | 7/2003 | Rossman |
| 6,596,654 | B1 | 7/2003 | Bayman et al. |
| 6,599,839 | B1 | 7/2003 | Gabriel et al. |
| 6,602,806 | B1 | 8/2003 | Xia et al. |
| 6,614,181 | B1 | 9/2003 | Harvey et al. |
| 6,624,064 | B1 | 9/2003 | Sahin et al. |
| 6,630,413 | B2 | 10/2003 | Todd |
| 6,645,303 | B2 | 11/2003 | Frankel et al. |
| 6,656,804 | B2 | 12/2003 | Tsujikawa et al. |
| 6,660,391 | B1 | 12/2003 | Rose et al. |
| 6,667,553 | B2 | 12/2003 | Cerny et al. |
| 6,670,284 | B2 | 12/2003 | Yin |
| 6,676,751 | B2 | 1/2004 | Solomon et al. |
| 6,682,659 | B1 | 1/2004 | Cho et al. |
| 6,682,969 | B1 | 1/2004 | Basceri et al. |
| 6,683,364 | B2 | 1/2004 | Oh et al. |
| 6,706,634 | B1 | 3/2004 | Seitz et al. |
| 6,716,770 | B2 | 4/2004 | O'Neill et al. |
| 6,756,085 | B2 | 6/2004 | Waldfried et al. |
| 6,762,126 | B2 | 7/2004 | Cho et al. |
| 6,787,191 | B2 | 9/2004 | Hanahata et al. |
| 6,794,290 | B1 | 9/2004 | Papasouliotis et al. |
| 6,800,571 | B2 | 10/2004 | Cheung et al. |
| 6,818,517 | B1 | 11/2004 | Maes |
| 6,819,886 | B2 | 11/2004 | Runkowske et al. |
| 6,830,624 | B2 | 12/2004 | Janakiraman et al. |
| 6,833,052 | B2 | 12/2004 | Li et al. |
| 6,833,322 | B2 | 12/2004 | Anderson et al. |
| 6,835,278 | B2 | 12/2004 | Selbrede et al. |
| 6,849,520 | B2 | 2/2005 | Kim et al. |
| 6,858,523 | B2 | 2/2005 | Deboer et al. |
| 6,858,533 | B2 | 2/2005 | Chu et al. |
| 6,867,086 | B1 | 3/2005 | Chen et al. |
| 6,872,323 | B1 | 3/2005 | Entley et al. |
| 6,875,687 | B1 | 4/2005 | Weidman et al. |
| 6,890,403 | B2 | 5/2005 | Cheung |
| 6,900,067 | B2 | 5/2005 | Kobayashi et al. |
| 6,955,836 | B2 | 10/2005 | Kumagai et al. |
| 6,958,112 | B2 | 10/2005 | Karim et al. |
| 7,018,902 | B2 | 3/2006 | Visokay et al. |
| 7,077,904 | B2 | 7/2006 | Cho et al. |
| 7,084,076 | B2 | 8/2006 | Park et al. |
| 7,087,497 | B2 | 8/2006 | Yuan et al. |
| 7,109,114 | B2 | 9/2006 | Chen et al. |
| 7,115,419 | B2 | 10/2006 | Suzuki |
| 7,122,222 | B2 | 10/2006 | Xiao et al. |
| 7,129,185 | B2 | 10/2006 | Aoyama et al. |
| 7,148,155 | B1 | 12/2006 | Tarafdar et al. |
| 7,176,144 | B1 | 2/2007 | Wang et al. |
| 7,183,177 | B2 | 2/2007 | Al-Bayati et al. |
| 7,192,626 | B2 | 3/2007 | Dussarrat et al. |
| 7,205,248 | B2 | 4/2007 | Li et al. |
| 7,220,461 | B2 | 5/2007 | Hasebe et al. |
| 7,297,608 | B1 | 11/2007 | Papasouliotis et al. |
| 7,335,609 | B2 | 2/2008 | Ingle et al. |

(56) References Cited

U.S. PATENT DOCUMENTS

| | | |
|---|---|---|
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2* | 11/2010 | Mallick et al. ............... 438/789 |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2* | 8/2012 | Mallick et al. ............... 438/787 |
| 8,304,351 B2* | 11/2012 | Wang et al. ............... 438/761 |
| 8,318,584 B2* | 11/2012 | Li et al. ............... 438/435 |
| 8,329,587 B2* | 12/2012 | Liang et al. ............... 438/697 |
| 8,445,078 B2* | 5/2013 | Liang et al. ............... 427/579 |
| 8,449,942 B2* | 5/2013 | Liang et al. ............... 427/255.31 |
| 8,466,067 B2* | 6/2013 | Liang et al. ............... 438/697 |
| 8,466,073 B2* | 6/2013 | Wang et al. ............... 438/787 |
| 8,551,891 B2* | 10/2013 | Liang et al. ............... 438/763 |
| 8,563,445 B2* | 10/2013 | Liang et al. ............... 438/792 |
| 8,629,067 B2* | 1/2014 | Liang et al. ............... 438/791 |
| 8,647,992 B2* | 2/2014 | Liang et al. ............... 438/763 |
| 8,741,788 B2* | 6/2014 | Liang et al. ............... 438/787 |
| 8,765,573 B2* | 7/2014 | Mallick et al. ............... 438/422 |
| 8,871,656 B2* | 10/2014 | Mallick et al. ............... 438/791 |
| 8,889,566 B2* | 11/2014 | Chatterjee et al. ............... 438/778 |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0086166 A1 | 7/2002 | Hendricks et al. |
| 2002/0127350 A1 | 9/2002 | Ishikawa et al. |
| 2002/0129769 A1 | 9/2002 | Kim et al. |
| 2002/0142585 A1 | 10/2002 | Mandal |
| 2002/0146879 A1 | 10/2002 | Fu et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1* | 12/2002 | Ballantine et al. ............... 438/795 |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0065253 A1 | 4/2004 | Tois et al. |
| 2004/0079118 A1 | 4/2004 | M'Saad et al. |
| 2004/0082131 A1* | 4/2004 | Tsujikawa et al. ............... 438/287 |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216844 A1 | 11/2004 | Janakiraman et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2006/0011984 A1 | 1/2006 | Curie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0159847 A1 | 7/2006 | Porter et al. |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |

(56) References Cited

U.S. PATENT DOCUMENTS

| | | |
|---|---|---|
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0277734 A1* | 12/2007 | Lubomirsky et al. ......... 118/715 |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1* | 12/2007 | Lubomirsky et al. ..... 118/723 R |
| 2007/0298585 A1 | 12/2007 | Lubomirsky et al. |
| 2008/0000423 A1 | 1/2008 | Fukiage |
| 2008/0014759 A1 | 1/2008 | Chua et al. |
| 2008/0026597 A1 | 1/2008 | Munro et al. |
| 2008/0038486 A1 | 2/2008 | Treichel et al. |
| 2008/0063809 A1 | 3/2008 | Lee et al. |
| 2008/0081104 A1 | 4/2008 | Hasebe et al. |
| 2008/0085607 A1 | 4/2008 | Yu et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0061647 A1 | 3/2009 | Mallick et al. |
| 2009/0075490 A1 | 3/2009 | Dussarrat et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1* | 4/2009 | Liang ............................ 438/788 |
| 2009/0104791 A1 | 4/2009 | Nemani et al. |
| 2009/0104798 A1 | 4/2009 | Hirano |
| 2009/0142935 A1 | 6/2009 | Fukazawa et al. |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0081094 A1 | 4/2010 | Hasebe et al. |
| 2010/0081293 A1 | 4/2010 | Mallick et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0255655 A1 | 10/2010 | Mallick et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0081782 A1* | 4/2011 | Liang et al. .................. 438/697 |
| 2011/0111137 A1 | 5/2011 | Liang et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0142192 A1 | 6/2012 | Li et al. |
| 2012/0145079 A1 | 6/2012 | Lubomirsky et al. |
| 2012/0177846 A1* | 7/2012 | Li et al. ........................ 427/579 |
| 2012/0190178 A1 | 7/2012 | Wang et al. |
| 2012/0213940 A1 | 8/2012 | Mallick |
| 2012/0225565 A1 | 9/2012 | Bhatia et al. |
| 2012/0238108 A1* | 9/2012 | Chen et al. ................... 438/765 |
| 2012/0269989 A1* | 10/2012 | Liang et al. ................. 427/579 |
| 2012/0309205 A1 | 12/2012 | Wang et al. |
| 2013/0084711 A1* | 4/2013 | Liang et al. .................. 438/763 |
| 2013/0149462 A1* | 6/2013 | Liang et al. .................. 427/539 |
| 2014/0248754 A1* | 9/2014 | Thadani et al. .............. 438/422 |

FOREIGN PATENT DOCUMENTS

| | | |
|---|---|---|
| EP | 1717848 A | 11/2006 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 05-259156 | 10/1993 |
| JP | 05-304147 A | 11/1993 |
| JP | 06-077150 A | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2004-327639 | 11/2004 |
| JP | 2005-142448 A | 6/2005 |
| JP | 2005-268396 A | 9/2005 |
| JP | 2005-302848 A | 10/2005 |
| JP | 2008-159824 A | 7/2008 |
| JP | 2008/218684 A | 9/2008 |
| JP | 2011-220127 A | 11/2011 |
| KR | 10-2004-0091978 A | 11/2004 |
| KR | 1020040104533 A | 12/2004 |
| KR | 10-2005-0003758 A | 1/2005 |
| KR | 10-2005-0094183 A | 9/2005 |
| KR | 1020060081350 A | 7/2006 |
| KR | 10-2009-011765 A | 2/2009 |
| KR | 10-2009-0122860 A | 12/2009 |
| TW | 200514163 | 4/2005 |
| TW | 200707582 | 2/2007 |
| WO | WO 02/077320 A1 | 10/2002 |
| WO | WO 03/066933 A | 8/2003 |

(56) References Cited

FOREIGN PATENT DOCUMENTS

| WO | WO 2007/040856 A2 | 4/2007 |
|---|---|---|
| WO | WO 2007/140376 A | 12/2007 |
| WO | WO 2007/140424 A | 12/2007 |
| WO | 2009/055340 A1 | 4/2009 |
| WO | 2012/145148 A2 | 10/2012 |

OTHER PUBLICATIONS

Aylett, B. J. et al., "Silicon-Nitrogen Compounds. Part VI. The Preparation and Properties of Disilazane," J. Chem. Soc. (A), 1969, pp. 639-642, Inorganic Physical Theory.
Aylett, B. J. et al., "The Preparation and Some Properties of Disilylamine-Correspondence," Inorganic Chemistry, 1966, p. 167.
Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.
Burg, Anton B. et al., "Silyl-Amino Boron Compounds," J. Amer. Chem. Soc., Jul. 1950, pp. 3103-3107, vol. 72.
Davison, A et al., "The Raman Spectra of Manganese and Rhenium Carbonyl Hydrides and Some Related Species," Inorganic Chemistry, Apr. 1967, pp. 845-847, vol. 6 No. 4.
Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages, pp. 1372-1379 & cover sheets.
Norman, Arlan D. et al., "Reaction of Silylphosphine with Ammonia," Inoragnic Chemistry, 1979, pp. 1594-1597, vol. 18 No. 6.
Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.
Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.
Ward, Laird G. L., "Bromosilane, Iodosilane, and Trisilylamine," Inorganic Syntheses, 1968, pp. 159-170, vol. 11.
Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York, excerpts are cover sheets & pp. 76-78.
Coltrin, M.E., et al., "Chemistry of AlGaN Particulate Formation," National Nuclear Security Administration, Physical, Chemical, & Nano Sciences Center, Research Briefs, 2005, pp. 42-43.
Wide Bandgap Semiconductor Materials & Devices (no month) English abstract of WO 2005/078784 A, Aug. 25, 2005, Toagosei Co. LTD.
Gulleri, G. et al., "Deposition Temperature Determination of HDPCVD Silicon Dioxide Films," 2005, Microelectronic Engineering, vol. 82, pp. 236-241, available online Aug. 24, 2005.
Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14, 187 pages.
Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.
Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.
Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.
English abstract of JP 9237785 A2 (Sep. 9, 1996)=DE19654737 (Jul. 3, 1997); Toshiba Kawasaki KK; Nara Akiko et al.; "Semiconductor Device and its Manufacture".
Alexandrov, S. E., et al., "Formation of Silicon Nitride Films by Remote Plasma-enhanced Chemical Vapour Deposition". Advanced Materials for Optics and Electronics, vol. 2, 301-312 (1993), (no month, but after Jul. 16).
Bowen, C., et al., "New Processing Techniques: Sweeping of Quartz Wafers and a Practical Method for Processing Quartz Resonators Under Controlled Conditions," Proceedings of the 1992 IEEE Frequency Control Symposium, pp. 648-656.
International Search Report and Written Opinion of PCT/US2011/054635, mailed Jul. 9, 2012, 11 pages.
International Search Report and Written Opinion of PCT/US2011/054981, mailed May 9, 2012, 10 pages.
International Search Report and Written Opinion of PCT/US2011/054984, mailed May 11, 2012, 10 pages.
International Search Report and Written Opinion of PCT/US2011/066601, mailed Jul. 20, 2012, 10 pages.
Loboda, M.J., et al., "Chemical influence of inert gas on the thin film stress in plasma-enhanced chemical vapor deposited a- SiN:H films". Journal of Materials Research, vol. 11, No. 2, Feb. 1996, pp. 391-398.
Franz, et al., "Conversion of silicon nitride into silicon dioxide through the influence of oxygen," Solid-State Electronics, Jun. 1971, pp. 449-505, vol. 14, Issue 6, UK, Abstract Only.
International Search Report and Written Opinion of PCT/US2011/066275, mailed Sep. 24, 2012, 9 pages.
International Search Report and Written Opinion of PCT/US2012/026786, mailed Jan. 2, 2013, 7 pages.
International Search Report and Written Opinion of PCT/US2012/031640 mailed Oct. 18, 2012, 10 pages.
International Search Report and Written Opinion of PCT/US2012/039629, mailed Dec. 26, 2012, 6 pages.
Tripp Terrance., "The Anodic Oxidation of Silicon Nitride Films on Silicon," Journal of the Electrochemical Society, 1970, pp. 157-159, 117(2), February.
Usenko, et al., "Silicon Nitride Surface Conversion into Oxide to Enable Hydrophilic Bonding," ECS Meeting Abstracts, 2010, 1 page, Abstract #1716, 218th ECS Meeting.

* cited by examiner

OXYGEN-DOPING FOR NON-CARBON RADICAL-COMPONENT CVD FILMS

CROSS REFERENCE TO RELATED APPLICATION

This application is a nonprovisional of, and claims the benefit of the filing date of U.S. Provisional Patent Application No. 61/265,865, filed Dec. 2, 2009, entitled "OXYGEN-DOPING FOR NON-CARBON FCVD FILMS" by Nitin Ingle et al., the entire disclosure of which is incorporated herein by reference for all purposes.

BACKGROUND OF THE INVENTION

Semiconductor device geometries have dramatically decreased in size since their introduction several decades ago. Modern semiconductor fabrication equipment routinely produces devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device narrow to a point where the aspect ratio of gap depth to its width becomes high enough to make it challenging to fill the gap with dielectric material. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with highly flowable precursor materials that may be applied in a liquid phase to a spinning substrate surface (e.g., SOG deposition techniques). These flowable precursors can flow into and fill very small substrate gaps without forming voids or weak seams. However, once these highly flowable materials are deposited, they have to be hardened into a solid dielectric material.

In many instances, the hardening process includes a heat treatment to remove carbon and hydroxyl groups from the deposited material to leave behind a solid dielectric such as silicon oxide. Unfortunately, the departing carbon and hydroxyl species often leave behind pores in the hardened dielectic that reduce the quality of the final material. In addition, the hardening dielectric also tends to shrink in volume, which can leave cracks and spaces at the interface of the dielectric and the surrounding substrate. In some instances, the volume of the hardened dielectric can decrease by 40% or more.

Thus, there is a need for new deposition processes and materials to form dielectric materials on structured substrates without generating voids, seams, or both, in substrate gaps and trenches. There is also a need for materials and methods of hardening flowable dielectric materials with a lower decrease in volume. This and other needs are addressed in the present application.

BRIEF SUMMARY OF THE INVENTION

Methods of forming silicon oxide layers are described. The methods include the steps of concurrently combining both a radical precursor and a radical-oxygen precursor with a carbon-free silicon-containing precursor. One of the radical precursor and the silicon-containing precursor contain nitrogen. The methods result in depositing a silicon-oxygen-and-nitrogen-containing layer on a substrate. The oxygen content of the silicon-oxygen-and-nitrogen-containing layer is then increased to form a silicon oxide layer which may contain very little nitrogen. The radical-oxygen precursor and the radical precursor may be produced in separate plasmas or the same plasma. The increase in oxygen content may be brought about by annealing the layer in the presence of an oxygen-containing atmosphere and the density of the film may be increased further by raising the temperature even higher in an inert environment.

Embodiments of the invention include methods of forming a silicon oxide layer on a substrate in a plasma-free substrate processing region in a substrate processing chamber. The methods include flowing a hydrogen-containing precursor into a first plasma region to produce a radical precursor while flowing an oxygen-containing precursor into a second plasma region to produce a radical-oxygen precursor; concurrently combining the radical precursor and the radical-oxygen precursor with a carbon-free silicon-containing precursor in the plasma-free substrate processing region. At least one of the hydrogen-containing precursor and the carbon-free silicon-containing precursor contain nitrogen. The methods further include depositing a silicon-oxygen-and-nitrogen-containing layer on the substrate and annealing the silicon-oxygen-and-nitrogen-containing layer at an annealing temperature in an oxygen-containing atmosphere to increase the oxygen-content and decrease the nitrogen-content to form a silicon oxide layer.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

Methods of forming silicon oxide layers are described. The methods include the steps of concurrently combining both a radical precursor and a radical-oxygen precursor with a carbon-free silicon-containing precursor. One of the radical precursor and the silicon-containing precursor contain nitrogen. The methods result in depositing a silicon-oxygen-and-nitrogen-containing layer on a substrate. The oxygen content of the silicon-oxygen-and-nitrogen-containing layer is then increased to form a silicon oxide layer which may contain very little nitrogen. The radical-oxygen precursor and the radical precursor may be produced in separate plasmas or the same plasma. The increase in oxygen content may be brought about by annealing the layer in the presence of an oxygen-containing atmosphere and the density of the film may be increased further by raising the temperature even higher in an inert environment.

Without binding the coverage of the claims to hypothetical mechanisms which may or may not be entirely correct, a discussion of some details may prove beneficial. Forming a film by combining a radical precursor with a carbon-free silicon-and-nitrogen-containing precursor in a plasma free region without a radical-oxygen precursor results in the formation of a silicon-and-nitrogen-containing film. This deposition method may result in a relatively open network which allows the silicon-and-nitrogen-containing film to be converted to silicon oxide by curing the film in ozone at a low temperature and subsequently annealing the film in an oxygen-containing atmosphere at higher temperature. The open network may allow the ozone to penetrate more deeply within the film, extending the oxide conversion in the direction of the substrate. Introducing a concurrent flow of a radical-oxygen precursor during the formation of the film results in a presence of oxygen throughout an open network of a silicon-oxygen-and-nitrogen-containing film. The presence of oxygen in the as-deposited film reduces the quantity of oxygen which must flow through the open network in order to convert the film to silicon oxide during subsequent processing. The concurrent exposure to radical-oxygen may serve to homogenize the oxygen content, lower the refractive index, increase the deposition rate and may allow the cure step to be reduced or even eliminated.

Exemplary Silicon Oxide Formation Process

Figure 1:
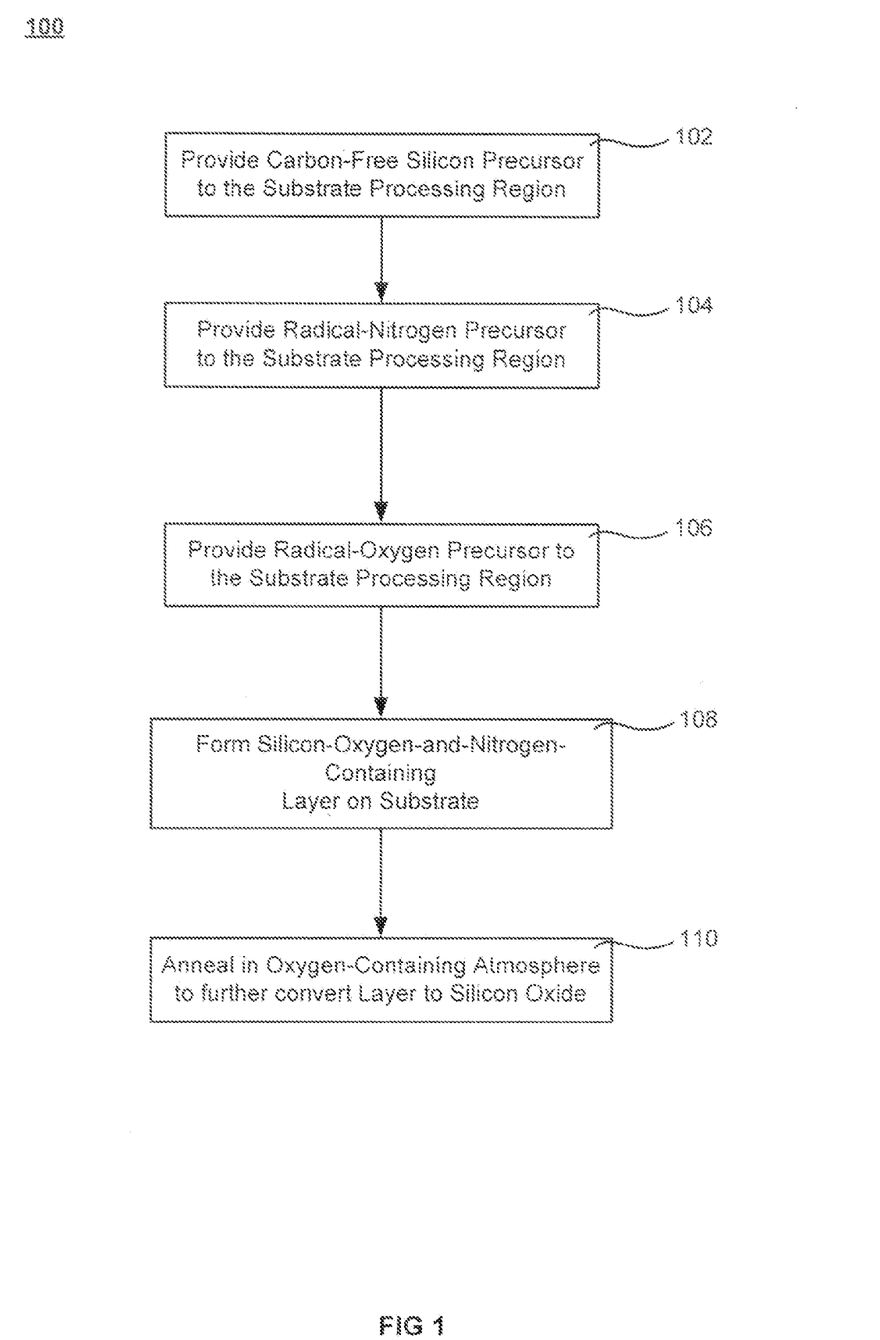
FIG. 1 is a flowchart illustrating selected steps for making a silicon oxide film according to embodiments of the invention.

FIG. 1 is a flowchart showing selected steps in methods 100 of making silicon oxide films according to embodiments of the invention. The method 100 includes providing a carbon-free silicon precursor to a plasma-free substrate processing region 102. The carbon-free silicon precursor may be, for example, a silicon-and-nitrogen precursor, a silicon-and-hydrogen precursor, or a silicon-nitrogen-and-hydrogen-containing precursor, among other classes of silicon precursors. The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

Specific examples of carbon-free silicon precursors may include silyl-amines such as $H_2N(SiH_3)$, $HN(SiH_3)_2$ (i.e. DSA), and $N(SiH_3)_3$ (i.e. TSA), among other silyl-amines. The flow rates of a silyl-amine may be greater than or about 200 sccm, greater than or about 300 sccm, greater than or about 500 sccm or greater than or about 700 sccm in different embodiments. All flow rates given herein refer to a dual chamber 300 mm substrate processing system. Single wafer systems would require half these flow rates and other wafer sizes would require flow rates scaled by the processed area. These silyl-amines may be mixed with additional gases that may act as carrier gases, reactive gases, or both. Examples of the these additional gases may include $H_2$, $N_2$, $NH_3$, He, and Ar, among other gases. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. Carbon-free silicon precursors may also include disilane, trisilane, even higher-order silanes, and chlorinated silanes, alone or in combination with one another or the previously mentioned carbon-free silicon precursors.

A radical-nitrogen precursor is also provided to the plasma-free substrate processing region 104. The radical-nitrogen precursor is a nitrogen-radical-containing precursor that was generated outside the plasma-free substrate processing region from a more stable nitrogen-containing precursor. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into the plasma-free substrate processing region. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine may also be used in place of or in combination with $NH_3$ in the mixtures with $N_2$ and $H_2$. The flow rate of the stable nitrogen precursor may be greater than or about 200 sccm, greater than or about 300 sccm, greater than or about 500 sccm or greater than or about 700 sccm in different embodiments. The radical-nitrogen precursor produced in the chamber plasma region may be one or more of —N, —NH, —$NH_2$, etc., and may also be accompanied by ionized species formed in the plasma.

In embodiments employing a chamber plasma region, the radical-nitrogen precursor is generated in a section of the substrate processing region partitioned from a deposition region where the precursors mix and react to deposit the silicon-and-nitrogen layer on a deposition substrate (e.g., a semiconductor wafer).

A radical-oxygen precursor is simultaneously provided to the plasma-free substrate processing region 106. The radical-oxygen precursor is an oxygen-radical-containing precursor that was generated outside the plasma-free substrate processing region from a more stable oxygen-containing precursor. For example, a stable oxygen-containing precursor compound containing $O_2$, $O_3$, $H_2O$, $H_2O_2$, NO, $NO_2$ and/or $N_2O$ may be activated in the chamber plasma region or a remote plasma system (RPS) outside the processing chamber to form the radical-oxygen precursor, which is then transported into the plasma-free substrate processing region. The radical-oxygen precursor may be generated in the same plasma as the radical-nitrogen precursor (the chamber plasma region or in a common RPS), in which case the more stable-oxygen-containing precursor and the more stable nitrogen-containing precursor may be combined in the plasma region or combined and flowed together into the plasma region. Alternatively, the radical-oxygen precursor may be generated in a separate plasma region, for example, the radical-oxygen precursor may be generated in an RPS and the radical-nitrogen precursor may be generated in the chamber plasma region. The flow rate of the stable oxygen precursor may be greater than or about 50 sccm, greater than or about 100 sccm, greater than or about 150 sccm, greater than or about 200 sccm or greater than or about 250 sccm in different embodiments. The flow rate of the stable oxygen precursor may be less than or about 600 sccm, less than or about 500 sccm, less than or about 400 sccm or less than or about 300 sccm in different embodiments. Any of these upper bounds may be combined with any of the lower bounds to form additional ranges for the flow rates of the stable oxygen precursor according to additional disclosed embodiments.

Generally speaking, a radical precursor which does not include nitrogen will also allow a silicon-and-nitrogen-containing layer to be formed. A radical precursor may be a radical-nitrogen precursor if it includes nitrogen supplied with the aforementioned precursors to the remote plasma region. The radical precursor is generated in a section of the reaction chamber partitioned from a deposition region where the precursors mix and react to deposit the silicon-and-nitrogen layer on a deposition substrate (e.g., a semiconductor wafer). In an embodiment where the radical precursor is a radical-nitrogen precursor, a stable nitrogen precursor is flowed into the remote plasma region and excited by a plasma. The stable nitrogen precursor (and the radical-nitrogen precursor) may also be accompanied by a carrier gas such as hydrogen ($H_2$), nitrogen ($N_2$), argon, helium, etc. A radical-nitrogen precursor formed from an input gas consisting essentially of nitrogen ($N_2$) (with or without additional inert carrier gases) has also been found to produce beneficial films in disclosed embodiments. The radical-nitrogen precursor may also be replaced by a radical precursor formed from an input gas consisting essentially of hydrogen ($H_2$) (and optionally inert carrier gases) in embodiments where the silicon-containing precursor comprises nitrogen.

In the substrate processing region, the concurrent flows of the radical-nitrogen precursor and the radical-oxygen precursor mix with the carbon-free silicon precursor (which has not been appreciably excited by a plasma) and react to deposit a silicon-oxygen-and-nitrogen-containing film on the deposition substrate 108. The deposited silicon-and-nitrogen-containing film may deposit conformally for low flow rates (low deposition rates). In other embodiments, the deposited silicon-and-nitrogen-containing film has flowable characteristics unlike conventional silicon nitride ($Si_3N_4$) film deposition techniques. The flowable nature of the formation allows the film to flow into narrow gaps trenches and other structures on the deposition surface of the substrate.

The flowability may be due to a variety of properties which result from mixing a radical precursors with carbon-free silicon precursor. These properties may include a significant hydrogen component in the deposited film and/or the presence of short chained polysilazane polymers. These short chains grow and network to form more dense dielectric material during and after the formation of the film. For example the deposited film may have a silazane-type, Si—NH—Si backbone (i.e., a Si—N—H film). When both the silicon precursor and the radical precursor are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however are much less than would be found in a silicon precursor having a carbon moiety (e.g., TEOS, TMDSO, etc.). The flowability of the deposited silicon-oxygen-and-nitrogen-containing film is not significantly compromised for the flow rates outlined in the embodiments recited herein.

Following the deposition of the silicon-oxygen-and-nitrogen-containing layer, the deposition substrate may be annealed in an oxygen-containing atmosphere 110. The deposition substrate may remain in the same substrate processing region used for curing when the oxygen-containing atmosphere is introduced, or the substrate may be transferred to a different chamber where the oxygen-containing atmosphere is introduced. The oxygen-containing atmosphere may include one or more oxygen-containing gases such as molecular oxygen ($O_2$), ozone ($O_3$), water vapor ($H_2O$), hydrogen peroxide ($H_2O_2$) and nitrogen-oxides (NO, $NO_2$, etc.), among other oxygen-containing gases. The oxygen-containing atmosphere may also include radical-oxygen and hydroxyl species such as atomic oxygen (O), hydroxides (OH), etc., that may be generated remotely and transported into the substrate chamber. Ions of oxygen-containing species may also be present. The oxygen anneal temperature of the substrate may be less than or about 1100° C., less than or about 1000° C., less than or about 900° C. or less than or about 800° C. in different embodiments. The temperature of the substrate may be greater than or about 500° C., greater than or about 600° C., greater than or about 700° C. or greater than or about 800° C. in different embodiments. Once again, any of the upper bounds may be combined with any of the lower bounds to form additional ranges for the substrate temperature according to additional disclosed embodiments.

A plasma may or may not be present in the substrate processing region during the oxygen anneal. The oxygen-containing gas entering the CVD chamber may include one or more compounds that have been activated (e.g., radicalized, ionized, etc.) before entering the substrate processing region. For example, the oxygen-containing gas may include radical-oxygen species, radical hydroxyl species, etc., activated by exposing more stable precursor compounds through a remote plasma source or through a chamber plasma region separated from the substrate processing region by a showerhead. The more stable precursors may include water vapor and hydrogen peroxide ($H_2O_2$) that produce hydroxyl (OH) radicals and ions, and molecular oxygen and/or ozone that produce atomic oxygen (O) radicals and ions.

A curing operation may be unnecessary given the significant oxygen content already present in the silicon-oxygen-and-nitrogen-containing film. However, if desired, a curing operation would be introduced prior to the annealing operation. During a cure, the deposition substrate may remain in the substrate processing region for curing, or the substrate may be transferred to a different chamber where the ozone-containing atmosphere is introduced. The curing temperature of the substrate may be less than or about 400° C., less than or about 300° C., less than or about 250° C., less than or about 200° C. or less than or about 150° C. in different embodiments. The temperature of the substrate may be greater than or about room temperature, greater than or about 50° C., greater than or about 100° C., greater than or about 150° C. or greater than or about 200° C. in different embodiments. Any of the upper bounds may be combined with any of the lower bounds to form additional ranges for the substrate temperature according to additional disclosed embodiments. No plasma is present in the substrate processing region, in embodiments, to avoid generating atomic oxygen which may close the near surface network and thwart subsurface oxidation. The flow rate of the ozone into the substrate processing region during the cure step may be greater than or about 200 sccm, greater than or about 300 sccm or greater than or about 500 sccm. The partial pressure of ozone during the cure step may be greater than or about 10 Torr, greater than or about 20 Torr or greater than or about 40 Torr. Under some conditions (e.g. between substrate temperatures from about 100° C. to about 200° C.) the conversion has been found to be substantially complete so a relatively high temperature anneal in an oxygen-containing environment may be unnecessary in embodiments.

The oxygen-containing atmospheres of both the curing and oxygen anneal provide oxygen to convert the silicon-oxygen-and-nitrogen-containing film into the silicon oxide ($SiO_2$) film. As noted previously, the lack of carbon in the silicon-oxygen-and-nitrogen-containing film results in significantly fewer pores formed in the final silicon oxide film. It also results in less volume reduction (i.e., shrinkage) of the film during the conversion to the silicon oxide. For example, where a silicon-nitrogen-carbon layer formed from carbon-containing silicon precursors may shrink by 40 vol. % or more when converted to silicon oxide, the substantially carbon-free silicon-and-nitrogen films may shrink by about 15 vol. % or less.

Figure 2:
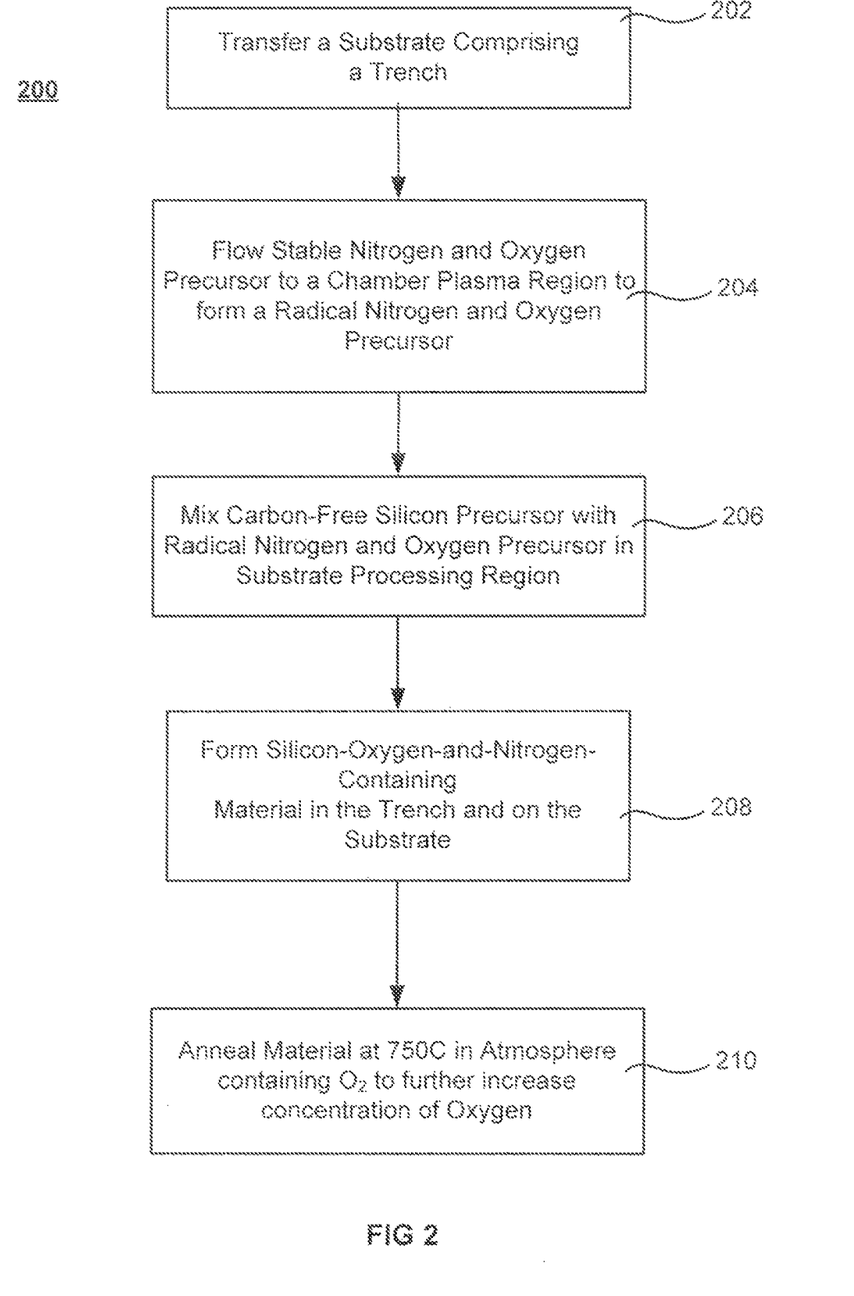
FIG. 2 is another flowchart illustrating selected steps for forming a silicon oxide film using a chamber plasma region according to embodiments of the invention.

Referring now to FIG. 2, another flowchart is shown illustrating selected steps in methods 200 for forming a silicon oxide film in a substrate gap (a trench) according to embodiments of the invention. The method 200 may include transferring a substrate comprising a gap into a substrate processing region (operation 202). The substrate may have a plurality of gaps for the spacing and structure of device components (e.g., transistors) formed on the substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., about 90 nm, 65 nm, 45 nm, 32 nm, 22 nm, 16 nm, etc.).

Concurrent flows of a stable nitrogen precursor and a stable oxygen precursor into a chamber plasma region form a radical-nitrogen precursor and a radical-oxygen precursor (operation 204). A carbon-free silicon precursor which has not been significantly excited by a plasma is mixed with the radical-nitrogen and radical-oxygen precursors in the plasma-free substrate processing region (operation 206). A flowable silicon-oxygen-and-nitrogen-containing layer may be deposited on the substrate (operation 208). Because the layer is flowable, it can fill gaps with high aspect ratios without creating voids or weak seams around the center of the filling material. For example, a depositing flowable material is less likely to prematurely clog the top of a gap before it is completely filled to leave a void in the middle of the gap.

The as-deposited silicon-oxygen-and-nitrogen-containing layer may then be annealed in an oxygen-containing atmosphere (operation 210) to transition the silicon-oxygen-and-nitrogen-containing layer to silicon oxide. A further anneal (not shown) may be carried out in an inert environment at a higher substrate temperature in order to densify the silicon oxide layer. Again, a curing step may be conducted to assist in the conversion to silicon oxide and would occur between the formation of the film (operation 206) and the annealing operation 210.

Annealing the as-deposited silicon-oxygen-and-nitrogen-containing layer in an oxygen-containing atmosphere forms a silicon oxide layer on the substrate, including the substrate gap 210. In embodiments, the processing parameters of curing and annealing possess the same ranges described with reference to FIG. 1. As noted above, the silicon oxide layer has fewer pores and less volume reduction than similar layers formed with carbon-containing precursors that have significant quantities of carbon present in the layer before the heat treatment step. In many cases, the volume reduction is slight enough (e.g., about 15 vol. % or less) to avoid post heat treatment steps to fill, heal, or otherwise eliminate spaces that form in the gap as a result of the shrinking silicon oxide.

In order to better understand and appreciate the invention, reference is now made to two films; a first film grown according to the process flow of FIG. 2 and otherwise similar second film grown without the radical-oxygen precursor. Each of the films was grown with TSA as the carbon-free silicon-and-nitrogen-containing precursor delivered at a flow rate of 275 sccm and ammonia ($NH_3$) delivered at a flow rate of 550 sccm into the chamber plasma region separated from the plasma-free substrate processing region by a showerhead. Molecular oxygen ($O_2$) was delivered at a flow rate of 150 sccm also into the chamber plasma region through a separate inlet from that used for the ammonia. Molecular oxygen was delivered during growth of the first film but not the second film. The first film grew with a deposition rate of 4800 Å/min whereas the second film grew at 1650 Å/min. The greater deposition rate is a further benefit in addition to aforementioned decrease in reliance on a separate curing operation. The refractive index of the first film is also lower (1.529) than that of the second film (1.5374) indicating that the as-deposited film is closer to the index of refraction for silicon oxide (1.46).

Figure 3:
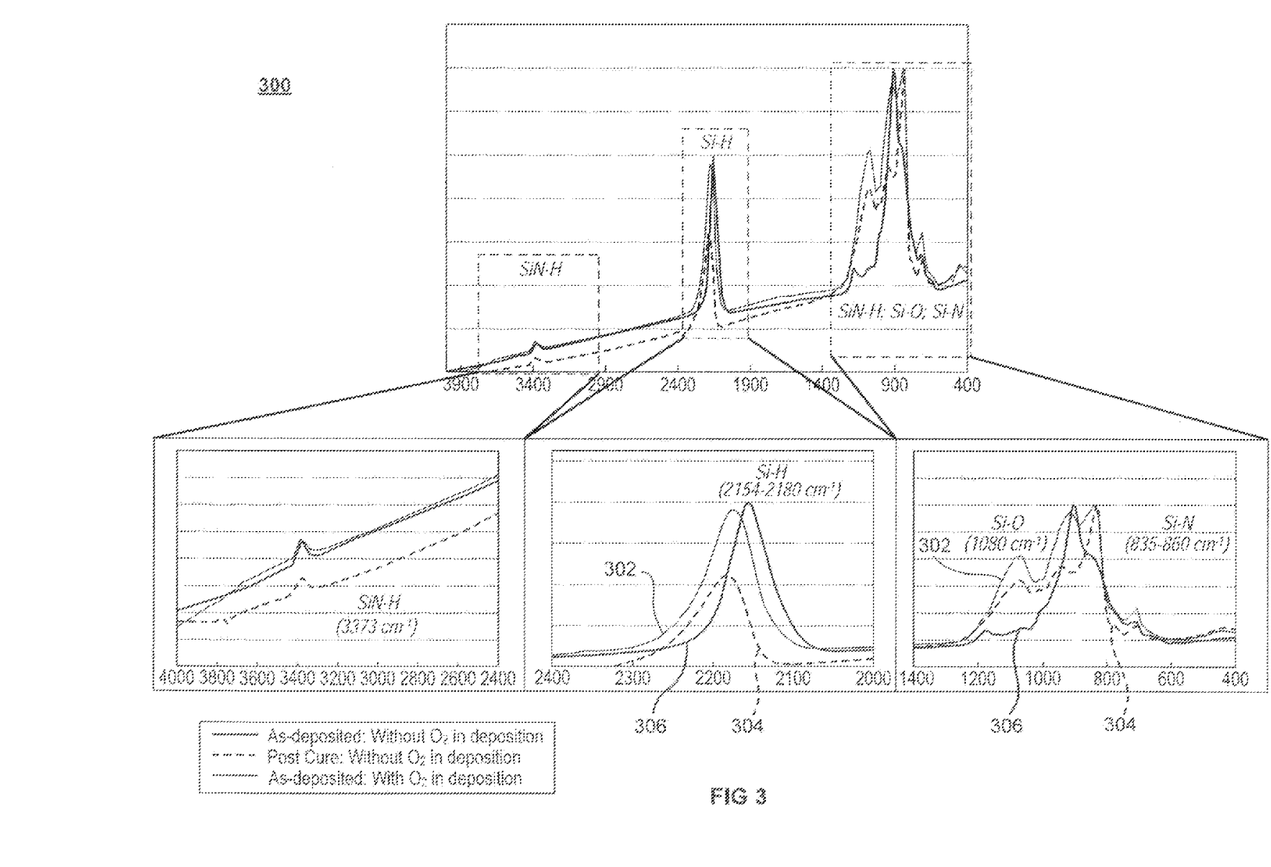
FIG. 3 is a graph of FTIR spectra taken with and without $O_2$ supplied during deposition according to embodiments of the invention.

FIG. 3 is a graph of FTIR spectra taken without and with $O_2$ supplied during deposition according to embodiments of the invention. The flow rates were 275 sccm for TSA, 550 sccm for $NH_3$ and 150 sccm for molecular oxygen (when used). An FTIR spectrum 302 is shown for an as-deposited silicon-oxygen-and-nitrogen-containing layer grown using molecular oxygen and ammonia to create radical-oxygen and radical-nitrogen precursors which were combined with TSA in the plasma-free substrate processing region. For comparison, an FTIR spectrum 304 is shown for an as-deposited silicon-and-nitrogen-containing layer and a spectrum 306 is also included for the same film following a low-temperature ozone cure. The FTIR peak locations are different for the film grown with and without radical-oxygen, however, once the film grown without radical-oxygen is cured, the peaks become more similar. In fact, the peaks associated with a presence of oxygen in the film are larger 302 for the film grown with the radical-oxygen precursor. The higher oxygen peaks 302 indicate a more significant presence of oxygen in the film when compared to the cured film 304. Clearly the ozone is not as effective at oxidizing the as-deposited silicon-and-nitrogen-containing film as the radical oxygen exposure during the growth of the film.

Exemplary Silicon Oxide Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 4:
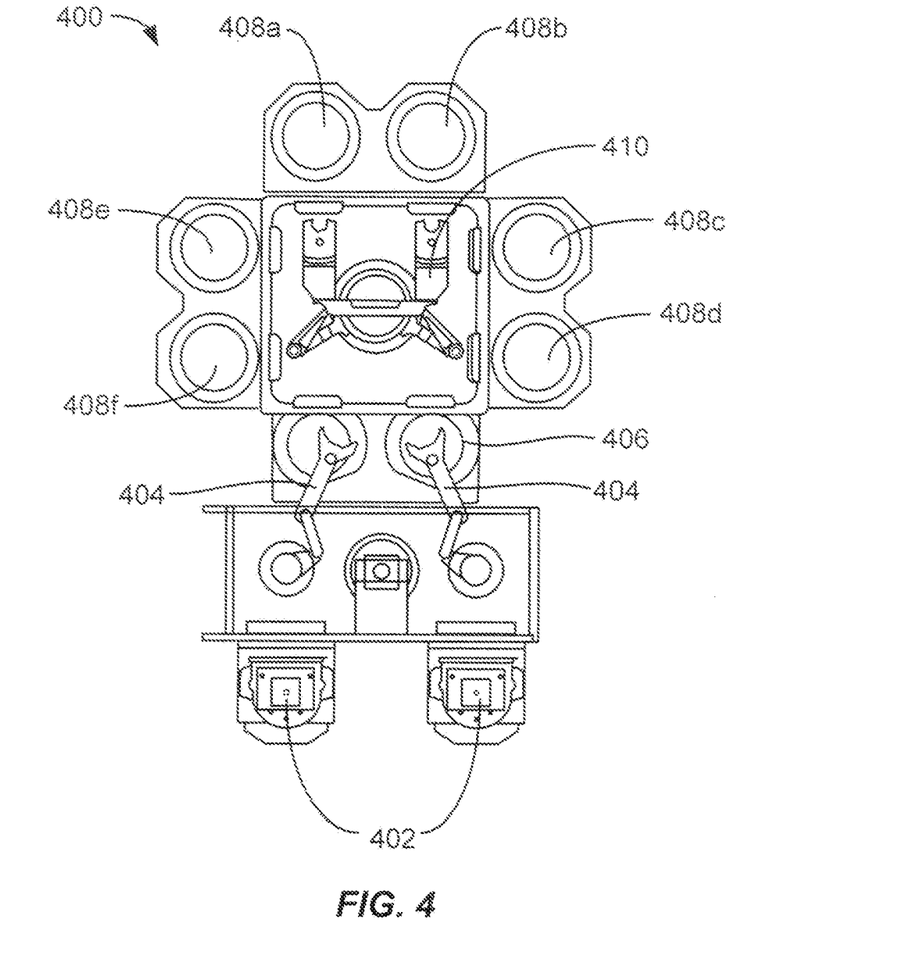
FIG. 4 shows a substrate processing system according to embodiments of the invention.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectic. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

In addition, one or more of the process chambers 408a-f may be configured as a wet treatment chamber. These process chambers include heating the flowable dielectric film in an atmosphere that include moisture. Thus, embodiments of system 400 may include wet treatment chambers 408a-b and anneal processing chambers 408c-d to perform both wet and dry anneals on the deposited dielectric film.

Figure 5A:
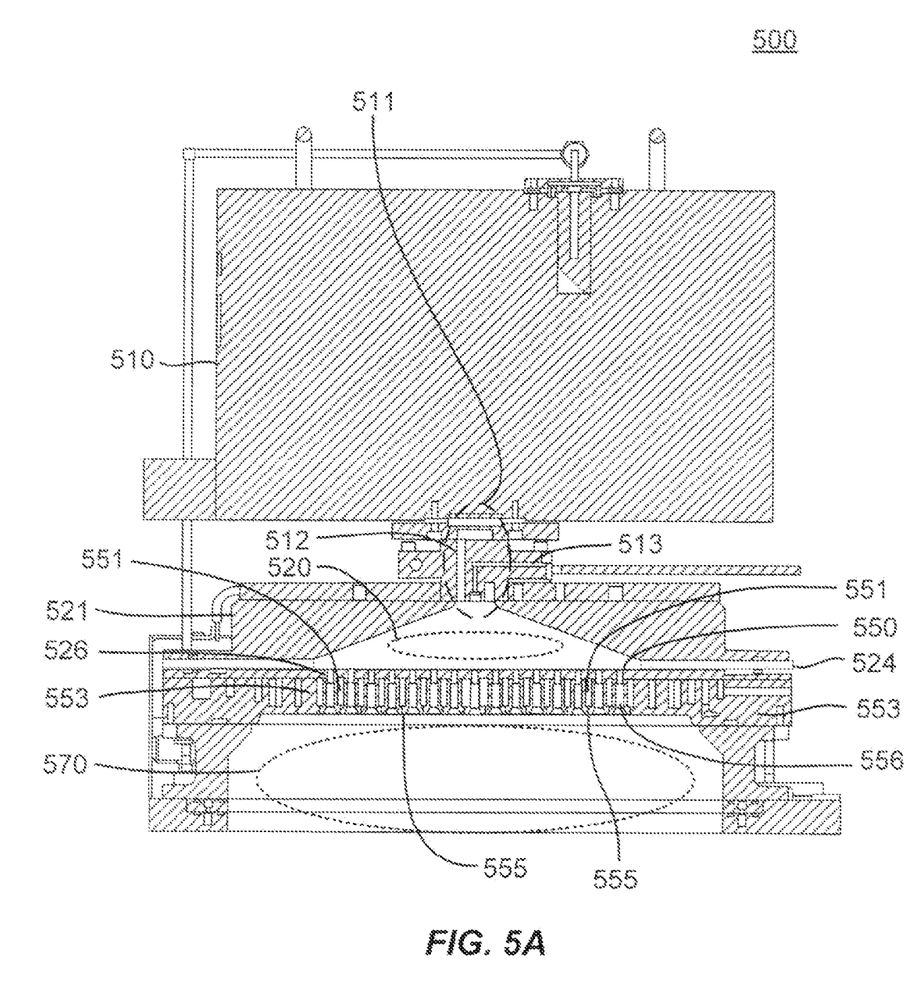
FIG. 5A shows a substrate processing chamber according to embodiments of the invention.

FIG. 5A is a substrate processing chamber 500 according to disclosed embodiments. A remote plasma system (RPS) 510 may process a gas which then travels through a gas inlet assembly 511. Two distinct gas supply channels are visible within the gas inlet assembly 511. A first channel 512 carries a gas that passes through the remote plasma system RPS 510, while a second channel 513 bypasses the RPS 500. The first channel 502 may be used for the process gas and the second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this disclosed embodiment. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less in disclosed embodiments.

In the embodiment shown, showerhead 553 may distribute (via through holes 556) process gases which contain oxygen, hydrogen and/or nitrogen and/or plasma effluents of such process gases upon excitation by a plasma in chamber plasma region 520. In embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. Molecular oxygen (or another relatively stable oxygen-containing gas) may be delivered through second channel 513 while ammonia (or another relatively stable nitrogen-and-hydrogen-containing gas) is delivered through first channel 512 to grow silicon-oxygen-and-nitrogen-containing films as described herein. Alternatively, the oxygen-containing gas and the nitrogen-and-hydrogen-containing gas may be combined and both flow through first channel 512 or second channel 513. The second channel 513 may also deliver a carrier gas and/or a film-curing gas used to remove an unwanted component from the growing or as-deposited film. Plasma effluents may include ionized or neutral derivatives of the process gas and may also be referred to herein as a radical-oxygen precursor and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in disclosed embodiments. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
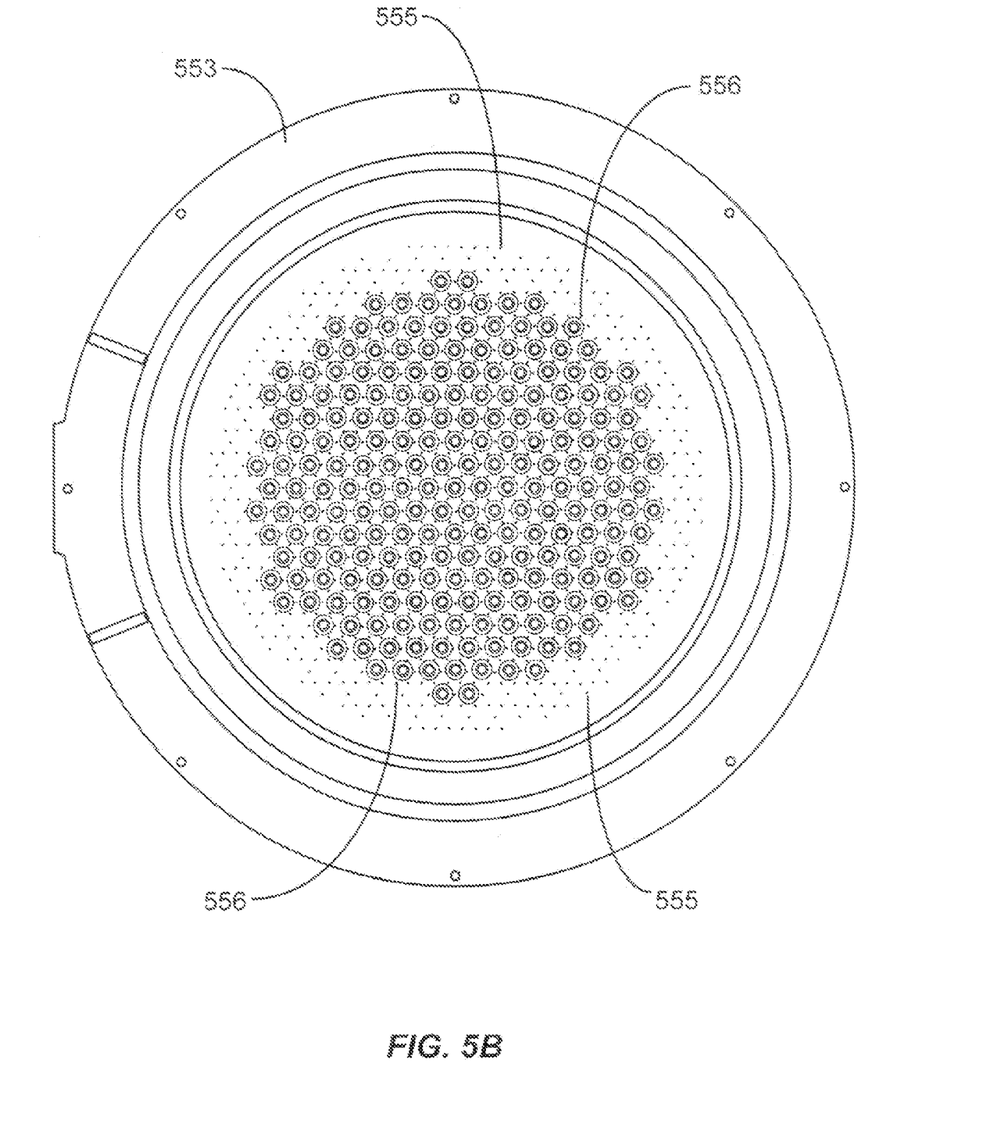
FIG. 5B shows a showerhead of a substrate processing chamber according to embodiments of the invention.

FIG. 5B is a bottom view of a showerhead 553 for use with a processing chamber according to disclosed embodiments. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. A plasma is present in chamber plasma region 520 to produce the radical-nitrogen and radical-oxygen precursors from an inflow of a nitrogen-and-hydrogen-containing gas and an oxygen-containing gas. An AC voltage typically in the radio frequency (RF) range is applied between the conductive top portion 521 of the processing chamber and showerhead 553 to ignite a plasma in chamber plasma region 520 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The chamber plasma region or a region in an RPS may be referred to as a remote plasma region. In embodiments, the radical precursor (e.g. a radical-nitrogen precursor) is created in the remote plasma region and travels into the substrate processing region where the carbon-free silicon-containing precursor is excited by the radical precursor. In embodiments, the carbon-free silicon-containing precursor is excited only by the radical precursor. Plasma power may essentially be applied only to the remote plasma region, in embodiments, to ensure that the radical precursor provides the dominant excitation to the carbon-free silicon-containing precursor.

In embodiments employing a chamber plasma region, the excited plasma effluents are generated in a section of the substrate processing region partitioned from a deposition region. The deposition region, also known herein as the substrate processing region, is where the plasma effluents mix and react with the carbon-free silicon-containing precursor to deposit the silicon-and-nitrogen layer on a deposition substrate (e.g., a semiconductor wafer). The excited plasma effluents may also be accompanied by inert gases (in the exemplary case, argon). The carbon-free silicon-containing precursor does not pass through a plasma before entering the substrate plasma region, in embodiments. The substrate processing region may be described herein as "plasma-free" during the growth of the silicon-and-nitrogen-containing layer. "Plasma-free" does not necessarily mean the region is devoid of plasma. Ionized species and free electrons created within the plasma region do travel through pores (apertures) in the partition (showerhead) but the carbon-free silicon-containing precursor is not substantially excited by the plasma power applied to the plasma region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" is used herein as a shorthand for and interchangeably with a silicon-and-oxygen-containing material. As such, silicon oxide may include concentrations of other elemental constituents such as nitrogen, hydrogen, carbon and the like. In some embodiments, silicon oxide films produced using the methods disclosed herein consist essentially of silicon and oxygen. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas may be a combination of two or more gases. A "radical precursor" is used to describe plasma effluents (a gas in an excited state which is exiting a plasma) which participate in a reaction to either remove material from or deposit material on a surface. A "radical-hydrogen precursor" is a radical precursor which contains hydrogen and a "radical-nitrogen precursor" contains nitrogen. Hydrogen may be present in a radical-nitrogen precursor and nitrogen may be present in a radical-hydrogen precursor. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "trench" is used throughout with no implication that the etched geometry has a large horizontal aspect ratio. Viewed from above the surface, trenches may appear circular, oval, polygonal, rectangular, or a variety of other shapes. The term "via" is used to refer to a low aspect ratio trench which may or may not be filled with metal to form a vertical electrical connection. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a patterned substrate having a trench in a plasma-free substrate processing region in a substrate processing chamber, the method comprising:
    flowing a hydrogen-containing precursor into a first plasma region to produce a radical precursor while flowing an oxygen-containing precursor into a second plasma region to produce a radical-oxygen precursor;
    concurrently combining the radical precursor and the radical-oxygen precursor with a carbon-free silicon-containing precursor in the plasma-free substrate processing region, wherein the carbon-free silicon-containing precursor contains nitrogen;
    depositing a flowable silicon-oxygen-and-nitrogen-containing layer on the substrate, wherein the flowable silicon-oxygen-and-nitrogen-containing layer flows into the trench on a deposition surface of the patterned substrate as the flowable silicon-oxygen-and-nitrogen-containing layer deposits; and
    annealing the silicon-oxygen-and-nitrogen-containing layer at an annealing temperature in an oxygen-containing atmosphere to increase the oxygen-content and decrease the nitrogen-content to form a silicon oxide layer.

2. The method of claim 1 wherein the annealing temperature is between about 500° C. and about 1100° C. and the oxygen-containing atmosphere comprises at least one of $O_2$, $O_3$, $H_2O$, $H_2O_2$, NO, $NO_2$, $N_2O$ and radical species derived therefrom.

3. The method of claim 1 wherein the first plasma region is the second plasma region so the radical precursor and the radical-oxygen precursor are produced in the same plasma.

4. The method of claim 1 wherein the second plasma region is in a remote plasma system (RPS) located outside the substrate processing chamber and the radical-oxygen precursor enters the plasma-free substrate processing region without passing through the first plasma region.

5. The method of claim 1 wherein the second plasma region is in a remote plasma system (RPS) located outside the substrate processing chamber and the radical-oxygen precursor enters the second plasma region where it is further excited before entering the plasma-free substrate processing region through channels also used by the radical precursor.

6. The method of claim 1 wherein a deposition rate of the flowable silicon-oxygen-and-nitrogen-containing layer is greater than or about 2000 Å/min.

7. The method of claim 1 wherein a deposition rate of the flowable silicon-oxygen-and-nitrogen-containing layer is greater than or about 3000 Å/min.

8. The method of claim 1 wherein a deposition rate of the flowable silicon-oxygen-and-nitrogen-containing layer is greater than or about 4000 Å/min.

9. The method of claim 1 wherein the flowable silicon-oxygen-and-nitrogen-containing layer comprises a carbon-free Si—O—N—H layer.

10. The method of claim 1 wherein the oxygen-containing precursor comprises at least one of $O_2$, $O_3$, $H_2O$, $H_2O_2$, NO, $NO_2$, $N_2O$ and radical species derived therefrom.

11. The method of claim 1 wherein a dielectric constant of the silicon oxide film is more consistent across the film compared with a film grown under otherwise similar conditions but without the radical-oxygen precursor.

12. The method of claim 1 wherein the trench has a width of about 50 nm or less and the flowable silicon-oxygen-and-nitrogen-containing layer is flowable during deposition and fills the trench.

13. The method of claim 12 wherein the silicon oxide layer in the trench is substantially void-free.

14. The method of claim 1 wherein the first plasma region is in a remote plasma system (RPS) located outside the substrate processing chamber.

15. The method of claim 1 wherein the first plasma region is a partitioned portion of the substrate processing chamber separated from the plasma-free substrate processing region by a showerhead.

16. The method of claim 1 further comprising an operation of curing the film in an ozone-containing atmosphere while maintaining a temperature below about 400° C.

\* \* \* \* \*